United States Patent [19]

Yamakawa et al.

[11] Patent Number: 5,034,357

[45] Date of Patent: Jul. 23, 1991

[54] HEAT-CONDUCTIVE ALUMINUM NITRIDE SINTERED BODY AND METHOD OF MANUFACTURING THE SAME

[75] Inventors: Akira Yamakawa; Masaya Miyake; Hitoyuki Sakanoue; Hisao Takeuchi; Koichi Sogabe; Akira Sasame, all of Hyogo, Japan

[73] Assignee: Sumitomo Electric Industries, Ltd., Osaka, Japan

[21] Appl. No.: 303,284

[22] Filed: Jan. 26, 1989

[30] Foreign Application Priority Data

Feb. 8, 1988 [JP] Japan ................................ 63-28270

[51] Int. Cl.$^5$ .............................................. C04B 35/58
[52] U.S. Cl. ......................................... 501/96; 501/98; 264/62; 264/65
[58] Field of Search ............................ 501/96, 97, 98

[56] References Cited

U.S. PATENT DOCUMENTS

| | | | |
|---|---|---|---|
| 3,833,389 | 9/1974 | Komeya et al. ................. | 106/55 |
| 4,803,183 | 2/1989 | Schwetz et al. ................. | 501/96 |
| 4,847,221 | 7/1989 | Horiguchi et al. | |

FOREIGN PATENT DOCUMENTS

| | | |
|---|---|---|
| 3627317 | 2/1987 | Fed. Rep. of Germany . |
| 71575 | 4/1985 | Japan . |
| 71576 | 4/1985 | Japan . |
| 96578 | 5/1985 | Japan . |
| 127267 | 7/1985 | Japan . |
| 155263 | 7/1986 | Japan . |
| 41766 | 2/1987 | Japan . |

OTHER PUBLICATIONS

Article entitled: "High Thermal Conductive AlN Ceramics by Pressureless Sintering in Reducing Atmosphere" (III)–Investigation of Additives—by Akihiro Horiguchi et al. (Toshiba R&D Center), pp. 969 & 970 of Proceeding for 1987 Yogyo Kyokai's Annual Meeting.

"Aluminum Nitride Substrates Having High Thermal Conductivity" by Iwase et al.; published in Solid State Technology/Oct. 1986.

Primary Examiner—William R. Dixon, Jr.
Assistant Examiner—Alan Wright
Attorney, Agent, or Firm—W. G. Fasse; D. H. Kane, Jr.

[57] ABSTRACT

An aluminum nitride sintered body mainly composed of aluminum nitride, contains 0.01 to 1.0 percent by weight of a rare earth element and 0.001 to 0.5 percent by weight of oxygen. Such a body has a thermal conductivity of at least 180 W/mK. For manufacturing such an aluminum nitride sintered body, aluminum nitride powder (201) is first prepared. At least one compound (203) containing a rare earth element is added to the aluminum nitride powder (201) to contain 0.01 to 1.0 percent by weight, in rare earth element conversion, of the compound. The ingredients are homogeneously mixed with each other. A green body is formed of the mixed powder and sintered at a temperature of 1500° to 2200° C. in a non-oxidizing atmosphere containing nitrogen.

23 Claims, 4 Drawing Sheets

FIG.1
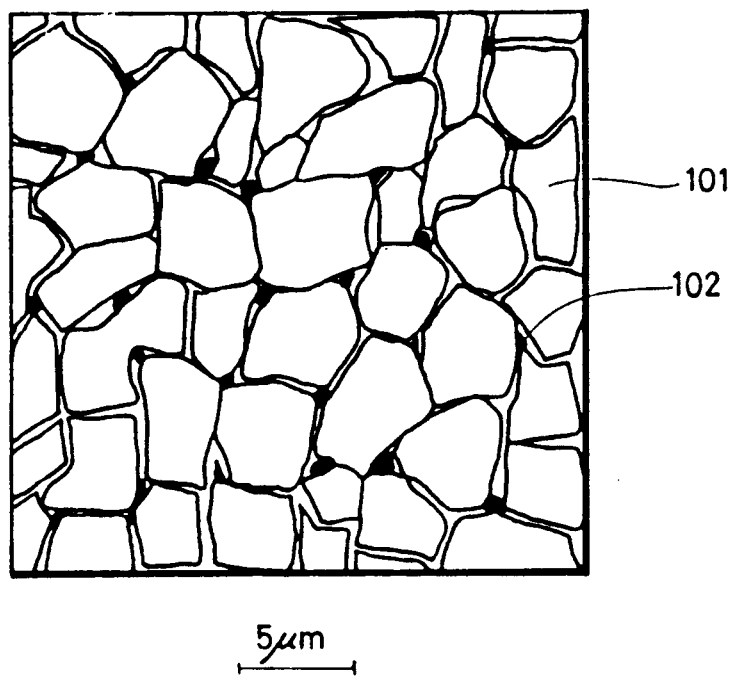
5μm
FIG.2A
PRIOR ART
FIG.2B
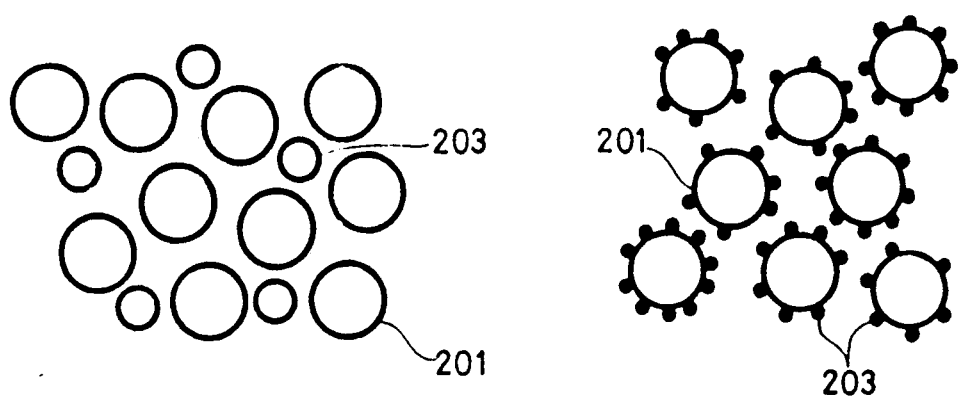

A : $Y_2O_3$ : 0.6wt‰, C : 0.7wt‰
B : $Y_2O_3$ : 0.3wt‰, C : 0.7wt‰
C : PRESENT INVENTION

HEAT-CONDUCTIVE ALUMINUM NITRIDE SINTERED BODY AND METHOD OF MANUFACTURING THE SAME

BACKGROUND OF THE INVENTION

1. Field of the Invention

The present invention relates to a heat-conductive aluminum nitride sintered body and a method of manufacturing the same. More particularly, the invention relates to a dense heat-conductive aluminum nitride sintered body having desirable characteristics such as an excellent heat conductivity, a high insulation resistance and permittivity or dielectric constant. A method of manufacturing the present body is also disclosed.

2. Description of the Background Art

Large scale integrated circuit (LSI) techniques have been remarkably advanced in recent years, particularly in improving the circuit density. An increase in chip size of a semiconductor integrated circuit (IC) also contributes to such improvement in the circuit density. The calorific power of a package for carrying an IC chip is increased with the increase in the IC chip size. Thus, importance has been attached to the heat radiation or dissipation of a material for an insulator substrate, which is applied in a package for a semiconductor device or the like. Such an insulator substrate is generally made of alumina ($Al_2O_3$). However, alumina has a small thermal conductivity of 30 W/mK, whereby alumina is inferior in its heat dissipation ability compared to its excellence in electrical insulation resistance and mechanical strength. Hence, it is inadequate to mount a field-effect transistor (FET) of high calorific power or the like, on an alumina substrate. Although there is an insulator substrate which is made of beryllia (BeO) having a high thermal conductivity for supporting a semiconductor element of high calorific power, safety measures for using such a substrate are complicated since beryllia is toxic.

With respect to an insulator substrate for supporting a semiconductor element of high calorific power, a heat-conductive aluminum nitride (AlN), which is non-toxic and equivalent to alumina in its electrical insulation resistance and mechanical strength, has been recently seen to be an effective insulating material for a semiconductor device or a package for such a device.

As hereinabove described, aluminum nitride theoretically has a high thermal conductivity and insulation resistance as a monocrystal material. However, since powder of aluminum nitride itself is inferior in its ability to sinter, the relative density of a sintered body prepared by forming such aluminum nitride powder and sintering the powder is about 70 to 80% at the most, of the theoretical density of aluminum nitride of 3.26 g/cm$^3$, depending on sintering conditions, since the sintered body contains a large amount of pores. Therefore, it is difficult to densify an aluminum nitride sintered body by independently employing aluminum nitride powder.

In an insulating ceramics member such as an aluminum nitride sintered body, thermal conduction takes place mainly through phonon conduction. Thus, phonon scattering is caused by defects such as pores, impurities, etc. contained in the sintered body, to reduce the level of its thermal conductivity. In order to obtain an aluminum nitride sintered body having high thermal conductivity, various proposals have been made as follows:

(1) Japanese Patent Laying-Open Gazette No. 96578/1985, for example, discloses a method of adding $Y_2O_3$, serving as a sintering assistant and a deoxidizer, to aluminum nitride powder and sintering the same.

(2) Each of Japanese Patent Laying-Open Gazettes Nos. 71576/1985 and 155263/1986, for example, discloses a method of adding carbon to aluminum nitride powder and sintering the same for deoxidation, thereby to obtain a sintered body having a small content of oxygen.

(3) Each of Japanese Patent Laying-Open Gazettes Nos. 71575/1985 and 127267/1985, for example, discloses a method of employing high purity aluminum nitride powder having a small content of oxygen.

(4) Japanese Patent Laying-Open Gazette No. 41766/1987, for example, discloses a method of decomposing/evaporating a sintering assistant remaining in a sintered body, to obtain an aluminum nitride sintered body of high purity.

(5) Proceedings of the 1987 Yogyo Kyokai's Annual Meeting p. 969, for example, discloses a method of removing a sintering assistant remaining in a sintered body by exposing the same to a reducing atmosphere for a long time.

In the above method (1) of adding $Y_2O_3$ and performing ball-mill mixing, it is necessary to add at least 1 percent by weight of $Y_2O_3$ in order to obtain a dense heat-conductive sintered body. However, the thermal conductivity of a sintered body thus obtained is about 200 W/mK at the most, and dispersion thereof is significant. If a large amount of $Y_2O_3$ is added, thick intergranular phases are formed around aluminum nitride particles, to reduce oxidation resistance of the sintered body while increasing the permittivity.

The above method (2) reduces the amount of oxygen contained in aluminum nitride through a deoxidizing action by the carbon. However, when no sintering assistant is added, the sintered body has a low thermal conductivity of about 80 W/mK since it is difficult to densify the low density of the sintered body as disclosed in Japanese Patent Laying-Open Gazette No. 71576/1985. If $Y_2O_3$ is to be added as a sintering assistant as disclosed in Japanese Patent Laying-Open Gazette No. 155263/1986, it is necessary to add at least 1 percent by weight of $Y_2O_3$ in order to density the sintered body.

According to Japanese Patent Laying-Open Gazette No. 71575/1985 listed in the above item (3), the amount of oxygen contained in the sintered body is at least 0.5 percent by weight while the sintered body has a low thermal conductivity of about 40 W/mK, even if aluminum nitride powder of high purity is employed as a raw material. As shown in Japanese Patent Laying-Open Gazette No. 127267/1985, the thermal conductivity of a sintered body obtained by adding at least 3 percent by weight of $Y_2O_3$, is about 70 W/mK.

As hereinabove described, an aluminum nitride sintered body obtained by adding a small amount of sintering assistant has a low thermal conductivity under the above described circumstances.

According to the above method (4) or (5) of adding a large amount of sintering assistant, sintering the material and thereafter removing the sintering assistant, it is assumed that an aluminum nitride sintered body thus obtained has high thermal conductivity exceeding 200 W/mK including an improvement in permittivity etc. However, according to a method of removing the sintering assistant by adding a fluoride, the sintering furnace is inevitably contaminated and differences in the characteristics of sintered bodies thus obtained, are increased not only in a lot of sintered bodies but even in the same sintered body, as shown in Japanese Patent Laying-Open Gazette No. 41766/1987. Further, the surface of the sintered body is so roughened that an after-treatment must inevitably be used, because of surface irregularities caused by evaporation and volatilization of the sintering assistant. According to the method of sintering the material in a reducing atmosphere for a long time as disclosed in "Proceedings of the 1987 Yogyo Kyokai's Annual Meeting", the costs of such sintering are much increased while the sintering assistant segregates in the sintered surface of the sintered body. Thus, the sintered body cannot be directly employed with such a rough sintered surface, while its characteristics vary within a large range.

SUMMARY OF THE INVENTION

An object of the present invention is to solve the aforementioned various technical problems of the prior art, and to provide a heat-conductive aluminum nitride sintered body which has high purity, high density and high thermal conductivity, and a method of manufacturing the same.

The present invention provides aluminum nitride ceramics of high density having a thermal conductivity of at least 180 W/mK and containing an extremely small amount of sintering assistant between the grain boundaries of aluminum nitride. The present inventors have found that, that upon a homogeneous distribution of aluminum nitride intergranular phases within the sintered body, the recrystallization of aluminum nitride progresses so as to attain a high density and high thermal conductivity while reducing the amount of oxygen, which is contained in the sintered body as an impurity, to be not more than 0.5 percent by weight, due to the presence of a substance reducing surface free energy of the aluminum nitride particles.

A heat-conductive aluminum nitride sintered body according to the present invention is mainly composed of aluminum nitride, and contains 0.01 to 0.8 percent by weight of a rare earth element and 0.2 to 0.5 percent by weight of oxygen, and has a thermal conductivity of at least 180 W/mK. Examples of rare earth elements are scandium, yttrium and lanthanoid series elements such as lanthanum, cerium, praseodymium, neodymium, promethium, samarium, europium, gadolinium, terbium, dysoprosium, holmium, erbium, thulium, ytterbium and lutetium, functioning as said sintering assistant.

If the content of the rare earth element is not more than 0.01 percent by weight, it is difficult to densify the sintered body while the content of oxygen is increased to reduce the thermal conductivity. If the content of the rare earth element exceeds 1.0 percent by weight, the permittivity is increased and oxidation resistance is reduced although the sintered body has a thermal conductivity of about 200 W/mK.

The general assumption that a dense sintered aluminum nitride body can be obtained with a content of a rear earth element of at least 1 percent by weight is believed to be based on the fact that heretofore a rare earth element has been generally used in the form of an oxide, a hydroxide or the like and was insufficiently mixed with aluminum nitride powder. Contrary thereto a dense sintered body having high thermal conductivity can be obtained according to the present invention by adding and mixing dense particles containing a rare earth element in the form of a compound such as stearic acid, even if the amount of the rare earth element, serving as a sintering assistant, is not more than 1 percent by weight.

FIGS. 2A and 2B are typical diagrams showing finely mixed states of aluminum nitride particles 201 and sintering assistant particles 203. FIG. 2A shows such a conventional mixed state that relatively large sintering assistant particles 203 are left between the aluminum nitride particles 201, as the result of insufficient mixing of the aluminum nitride particles 201 and the sintering assistant particles 203. On the other hand, FIG. 2B shows such a mixed state according to the present invention wherein fine sintering assistant particles 203 adhere to the surfaces of the aluminum nitride particles 201 whereby a homogeneous mixture is achieved.

The amount of oxygen contained in a sintered body exerts a significant influence on the thermal conductivity of the sintered body. Therefore, the amount of oxygen contained in the inventive aluminum nitride sintered body is limited in a range of 0.001 to 0.5 percent by weight. If the content of oxygen exceeds 0.5 percent by weight, the thermal conductivity of at least 180 W/mK cannot be obtained. If the content of oxygen is not more than 0.001 percent by weight, on the other hand, the density of the sintered body is not as high as desired. Further, the manufacturing costs increase very much for obtaining an oxygen content of not more than 0.001 percent by weight.

The average particle size of aluminum nitride particles forming the present aluminum nitride sintered body is preferably at least 5 $\mu$m. Following particle growth of the aluminum nitride particles, defects such as pores, oxygen etc. contained therein are discharged from intergranular parts, thereby to improve the thermal conductivity of the aluminum nitride sintered body. In other words, an insufficient particle growth of the aluminum nitride particles leads to low thermal conductivity of the sintered body.

The present aluminum nitride sintered body contains an extremely small amount of intergranular phases. The intergranular phases are present in such a small amount that it is hard to detect the same by X-ray diffraction, in thickness of not more than 1 $\mu$m. The intergranular phases are bad thermal conductors, which are assumed to reduce the thermal conductivity of aluminum nitride. Therefore, the amount of such intergranular phases is preferably reduced to that minimum at which the degree of sintering is not lowered. An aluminum nitride sintered body having high thermal conductivity can be obtained if the intergranular phases, which are substantially not more than 1 $\mu$m in thickness, are scattered between the grain boundaries.

The intergranular phases, containing a rare earth element, aluminum, oxygen and nitrogen, are present in a ratio of not more than 0.9 percent by volume in the sintered body. The intergranular phases are in the composition of a high-temperature molten solution obtained by reaction of the rare earth element added as a sintering assistant with aluminum and oxygen present in the surfaces and interiors of aluminum nitride particles, which molten solution solution-treats nitrogen. The rare earth element added as a sintering assistant serves to deoxidize aluminum nitride. As mentioned above, the amount of the intergranular phases contained in the sintered body is preferably not more than 0.9 percent by volume. If the amount of intergranular phases exceeds 0.9 percent by volume, the thermal conductivity of the sintered body is reduced. The content of the intergranular phases varies with the amount of addition of the rare earth element, with the amount of oxygen contained in the raw material of aluminum nitride powder as an impurity, with the sintering conditions and the like. However, a heat-conductive sintered aluminum nitride body can be obtained if the content of the intergranular phases is not more than 0.9 percent by volume. The amount of the rare earth element contained in the sintered body is substantially equivalent to the amount of that added to the mixed powder serving as a raw material. Thus, the amount of reduction of the rare earth element is extremely small.

The present aluminum nitride sintered body contains carbon. The content of carbon is at least 0.001 percent and not more than 0.1 percent by weight. The ratio of the content of carbon to that of the rare earth element is within a range of 1/100 to 1/10. If the content of carbon exceeds 0.1 percent by weight, the density of the sintered body is reduced and so is its thermal conductivity. Its dielectric voltage resistance is also very much reduced. Although the mechanism of the effect of carbon present in the sintered aluminum nitride body is not yet clear, it may be considered that a small amount of carbon acts to reduce the content of oxygen in the aluminum nitride.

According to the present aluminum nitride sintered body, no significant change is caused in distribution of the rare earth element in the sintered body. According to the conventional method of adding a large amount of sintering assistant to densify the material and thereafter removing the sintering assistant during sintering, the sintering assistant segregates on the surface of the sintered body, such that most of the sintering assistant is changed into a nitride resulting in a rough surface. Thus, it is impossible to directly use the sintered body having the sintered surface in this rough state. According to the present invention, on the other hand, no large segregation of the rare earth element is caused during sintering, whereby the sintered body can be directly used since its sintered surface is smooth. The sintered body according to the present invention has a high density and a high thermal conduction due to the addition of a small amount of sintering assistant. Thus, it is not necessary to remove the sintering assistant during sintering. This is an important advantage of the invention.

Surface roughness of the present sintered body, which is in the state of a sintered surface, is not more than 5 μm in Rmax. According to the prior art, surface roughness of a sintered surface has inevitably exceeded 10 μm in Rmax. Surface roughness of a sintered body to be employed as a circuit board must be about 5 μm. The present sintered body having a high thermal conductivity can be directly applied to a circuit board in the state in which its surface has been formed as a result of the sintering.

Preferably a C-axis lattice constant of aluminum nitride particles is at least 4.9800 Å in the body of the present invention. Upon solution treatment with oxygen, the lattice constant of aluminum nitride may be reduced. Thus, it may be assumed that the purity of aluminum nitride is reduced and an aluminum nitride sintered body having a high thermal conductivity cannot be obtained when the lattice constant is less than 4.9800 Å.

Aluminum nitride ceramics obtained by the present invention are extremely resistant against exposure to beams such as electron beams, cation beams and the like, as well as to sputtering by these beams. Thus, the present aluminum nitride sintered body has an excellent performance when exposed to electron beams, plasma or the like. This may be considered to be due to the fact that a local temperature increase caused by exposure to such beams is small, since the present aluminum nitride has a high thermal conductivity resulting in small selective damage of intergranular phases which are recessive to beam application.

The aluminum nitride sintered body obtained by the present invention has a permittivity of not more than 7.6 under a high frequency of 10 GHz. Such low permittivity is particularly important for a substrate for carrying a high-frequency element of a high speed switching device. The inventive sintered body has a low permittivity as a whole, since the same contains only a slight amount of intergranular phases having high permittivity.

According to the present method of manufacturing an aluminum nitride sintered body, aluminum nitride powder is first prepared. At least one compound containing a rare earth element is added to this aluminum nitride powder, so that the mixed powder thus obtained contains 0.01 to 1.0 percent by weight of the rare earth element. The mixing is performed in an organic solvent by a conventional method. Mixing in water is not preferred since the aluminum nitride powder would be oxidized. The mixed powder thus obtained is formed with a forming assistant such as paraffin, polyvinyl butyral (PVB), polyethylene glycol (PEG) or the like. A substance such as phenol resin, which is decomposed to leave carbon, carbon powder, graphite powder or the like may be added to control the carbon content remaining in a sintered body according to the invention. The rare earth compound is prepared as astearic acid compound, palmitic acid compound, alkoxide lead nitrate, carbonate, hydroxide or the like. A high molecular compound such as a stearic acid compound is preferably employed. It may be assumed that such a compound enables the reduction of the content of the rare earth element to facilitate mixing with aluminum nitride powder.

Particularly the stearic acid compound is the most preferable rare earth compound in the form of a rare earth metal stearate, due to its mixability with the aluminum nitride powder, due to its control of the amount of residual carbon etc., in addition to its action as a forming assistant.

The aluminum nitride powder must be in the form of fine homogeneous particles, the average particle size of which is preferably not more than 1 μm. The amount of oxygen contained in the aluminum nitride powder is preferably not more than 2.0 percent by weight. It is difficult to obtain such aluminum nitride powder by a direct nitriding method, i.e., a method through nitriding of metal aluminum. The aluminum nitride powder is obtained by a reduction nitriding method by a reduction nitriding of aluminum oxide. When the aluminum nitride powder is to be obtained by the direct nitriding method, control of reaction, classification of particle size etc. must be sufficiently considered. After the mixed powder is formed, the green body is sintered in a non-oxidizing atmosphere containing nitrogen at a sintering temperature of 1,500 to 2,200° C. In order to attain a high thermal conductivity, it is preferable to sinter the green body at a temperature of 1,800 to 2,100° C. for at least five hours, so that the aluminum nitride particles are at least 5 μm in average particle size. After the sintering step, the sintered body is quickly cooled. If the sintered body is slowly cooled, the sintering assistant is precipitated whereby the smoothness of the sintered surface deteriorates very much. The sintered body is preferably cooled at a rate of at least 200° C./h to a temperature of 1,500° C.

The aluminum nitride sintered body obtained according to the present invention is provided thereon with a conductor circuit through metal paste, to be applied to a circuit board. The present body is also suitable for use in a ceramic package for a semiconductor device wherein the present body forms a substrate. A semiconductor element is mounted on the major surface of the substrate and a lead frame is joined to the major surface of the substrate.

The metal paste employed for forming a circuit pattern is prepared by adding a glass component or the like to a metal having a high melting point such as tungsten or molybdenum, or a conductor metal such as copper, gold, silver, silver-palladium or the like. A resistor pattern may be formed by a metal paste prepared by adding a glass component or the like to a resistor of $RuO_2$ or the like. A substrate formed by the present sintered body, which is excellent in homogeneity and purity, has a high adhesion strength with respect to metal paste. Thus, a highly reliable circuit board can be obtained. Further, it is also possible to form a thin metal layer of Ti, Au, Ni, TaN or the like on a surface of the present aluminum nitride sintered body by ion plating, sputtering or the like, thereby to form a circuit pattern. Such a circuit pattern formed on the present sintered body has an improved plating stability upon formation of the circuit pattern, and a better stability against the heat applied for firing the paste in a normal atmosphere. With regard to the just mentioned characteristics, the present aluminum nitride sintered body is also superior compared to a circuit board made of a conventional aluminum nitride sintered body.

In a ceramic package made of the present sintered body, it is effective to interpose a stress relaxation member such as a copper plate, for relaxing a thermal stress caused between a lead frame and a substrate of the laluminum nitride sintered body, in order to ensure the strength of the lead frame. Further, a heat sink made of a copper-tungsten alloy plate or the like, may be joined to the aluminum nitride sintered body used as a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view showing typical crystal structure of an aluminum nitride sintered body according to the present invention;

FIG. 2A is a typical diagram showing a mixed state of aluminum nitride particles and sintering assistant particles in a step of manufacturing a conventional aluminum nitride sintered body;

FIG. 2B is a typical diagram showing a mixed state of aluminum nitride particles and sintering assistant particles in a step of manufacturing an aluminum nitride sintered body according to the present invention;

DESCRIPTION OF THE PREFERRED EMBODIMENTS AND OF THE BEST MODE OF THE INVENTION

EXAMPLE 1

Yttrium stearate in an amount shown in Table 1 and 10 percent by weight of PVB polyvinylbutyral, serving as a forming assistant, were added to aluminum nitride powder having an average particle size of 0.4 μm and an oxygen content of 1.4 percent by weight, to be sufficiently mixed with each other in ethanol. The powder mixture thus obtained was formed into a thin plate of 35 mm × 35 mm × 3 mm by a mechanical press to form a green body which was sintered in a nitrogen air current under the conditions shown in Table 1. Table 1 also shows characteristics of each sintered body thus obtained. It is understood that an aluminum nitride sintered body having a high thermal conductivity and a low permittivity can be obtained with an amount of yttrium (Y) within a range of 0.01 to 1.0 percent by weight, and an amount of oxygen of not more than 0.5 percent by weight. FIG. 1 is a sectional view showing the structure of a sintered body obtained from sample No. 4 in Table 1. It is clear from FIG. 1 that the crystals of aluminum nitride particles 101 are uniform. It is also seen in FIG. 1 that an extremely small amount of intergranular phases 102 is scattered in grain boundaries between the aluminum nitride particles 101 whereby the intergranular phases are separated from each other as shown. The oxygen content was analyzed through gas analysis after pulverizing each sintered body into particles of about 200 μm in particle size.

TABLE 1

| | | | Characteristics of Sintered Body | | | | | | |
|---|---|---|---|---|---|---|---|---|---|
| Sample No. | Amount of Y (wt. %) | Sintering Condition | Relative Density (%) | Thermal Conductivity (W/mK) | Permittivity (10 MHz) | Permittivity (10 GHz) | Oxygen Content (wt. %) | Y Content (wt. %) | A (Å) |
| *1 | 0 | 1950° C. for 5 h. | 92 | 65 | 8 | 7.3 | 1.0 | 0 | |
| 2 | 0.1 | ↓ | 99 | 190 | 8 | 7.3 | 0.5 | 0.1 | 4.9800 |
| 3 | 0.3 | ↓ | 100 | 220 | 8 | 7.3 | 0.3 | 0.3 | 4.9805 |
| 4 | 0.6 | ↓ | ↓ | 230 | 8 | 7.3 | 0.2 | 0.6 | 4.9815 |
| 5 | 0.9 | ↓ | ↓ | 240 | 8 | 7.3 | 0.1 | 0.9 | 4.9815 |
| *6 | 1.2 | ↓ | ↓ | 240 | 10 | 9.0 | 0.2 | 1.2 | 4.9815 |
| *7 | 3.0 | ↓ | ↓ | 230 | 13 | 12.0 | 1.0 | 3.0 | 4.9817 |

TABLE 1-continued

| Sample No. | Amount of Y (wt. %) | Sintering Condition | Relative Density (%) | Thermal Conductivity (W/mK) | Permittivity (10 MHz) | Permittivity (10 GHz) | Oxygen Content (wt. %) | Y Content (wt. %) | A (Å) |
|---|---|---|---|---|---|---|---|---|---|
| 8 | 0.5 | 1900° C. for 1 h. | 100 | 190 | 8 | 7.3 | 0.5 | 0.5 | 4.9800 |
| *9 | 0.5 | 1800° C. for 1 h. | 95 | 85 | 8 | 7.3 | 0.9 | 0.5 | 4.9770 |
| 10 | 0.5 | 2100° C. for 3 h. | 100 | 230 | 8 | 7.3 | 0.2 | 0.4 | 4.9815 |
| *11 | 0.5 in $Y_2O_3$ | " | 98 | 110 | 8 | 7.3 | 0.8 | 0.4 | 4.9800 |

*Reference Example

EXAMPLE 2

Figure 3:
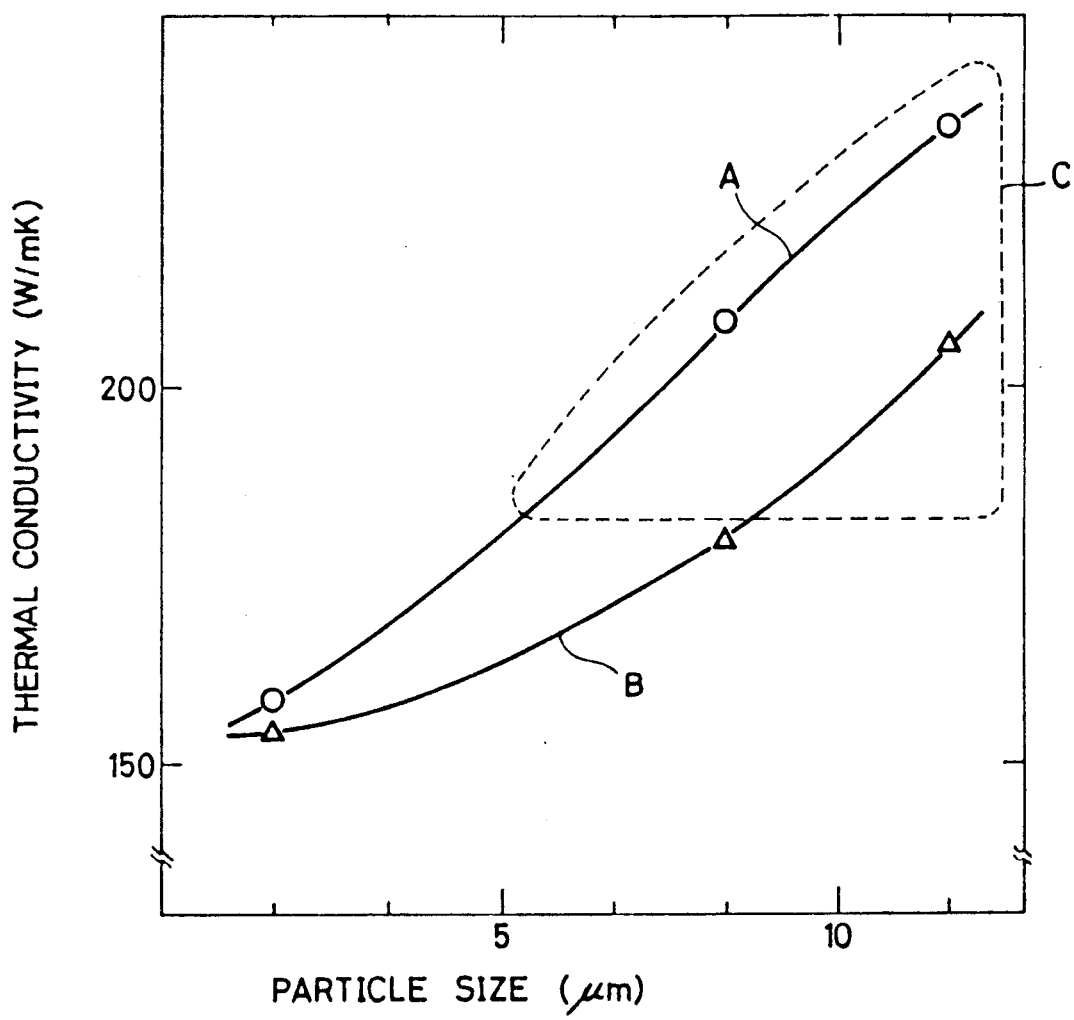
FIG. 3 is a graph showing measurements obtained from Example 2 for proving that the present aluminum nitride sintered body has a high thermal conductivity.

FIG. 3 shows the measurements made in an experiment using sample No. 4 shown in Table 1 while changing the sintering time. Aluminum nitride particles in a sintered body obtained in the experiment were varied in grain size with the sintering time. As shown in FIG. 3, the first sintered body having a thermal conductivity of at least 180 W/mK was obtained when the average particle size of the aluminum nitride particles exceeded 5 μm. In other words, it is important to sufficiently recrystallize the aluminum nitride in order to obtain a sintered body having a high thermal conductivity. Referring to FIG. 3, each of samples expressed in curves A and B, showing the measured results contained 0.7 percent by weight of carbon after forming and before sintering, while the carbon content was reduced to be below 0.1 percent by weight after sintering.

EXAMPLE 3

Yttrium stearate in the amount shown in Table 2 and 10 percent by weight of paraffin, serving as a forming assistant, were added to aluminum nitride powder having an average particle size of 0.4 μm and an oxygen content of 1.4 percent by weight, and sufficiently mixed with each other in ethanol. Thereafter the mixture was dried and the powder mixture thus obtained was formed into a plate of 35 mm × 35 mm × 3 mm by a mechanical press. The green body thus obtained was sintered in a nitrogen air current under sintering conditions shown in Table 2. The contents of oxygen, carbon and yttrium (Y) in a sintered body thus obtained were analyzed, followed by measuring the thermal conductivity. As the result, it is shown that a sintered body having a particularly high thermal conductivity can be obtained when the amount of residual carbon in the sintered body is not more than 0.1 percent by weight and the ratio of the content of carbon to that of a rare earth element is within a range of 1/100 to 1/10.

REFERENCE EXAMPLE

A formed green body of the sample No. 7 in Table 1 was sintered in a carbon case at a temperature of 1,950° C. for 72 hours, to obtain an aluminum nitride sintered body having a relative density of 100%, a thermal conductivity of 240 W/mK, a permittivity of 8 at 10 MHz and 7.3 at 10 GHz, an oxygen content of 0.1 percent by weight and a yttrium content of 0.6 percent by weight. However, segregation of YN appeared on the sintered surface resulting in a roughness proving that this sintered body cannot be directly employed as a material for a substrate.

On the other hand, no segregation of YN or another second phase was observed, rather, the aluminum nitride particles were homogeneously present in a sintered body according to the present invention.

EXAMPLE 5

Mixed powder obtained by adding 1.5 percent by weight of CaO powder to aluminum nitride powder having an average particle size of 0.4 μm and an oxygen content of 1.4 percent by weight was press-formed, to obtain a formed green body of 35 mm × 35 mm × 1.0 mm. This formed green body was sintered in an air current at a temperature of 2,000° C. for 10 hours, to obtain a sintered body having a relative density of 100%, a thermal conductivity of 210 W/mK, a permittivity of 8 to 10 MHz and 7.3 at 10 Ghz, an oxygen content of 0.2 percent by weight and a Ca content of 0.1 percent by weight. The sintered body thus obtained had an extremely irregular sintered surface, with a surface roughness of 10 μm in Rmax. Thus, it was impossible to directly employ this sintered body as a material for a substrate.

In place of the CaO powder, yttrium stearate of 1.5 percent by weight (0.15 percent by weight in yttrium element conversion) was added to obtain mixed powder, which was sintered to prepare a sintered body according to the present sintering method. The surface roughness of the sintered body was 4 μm in Rmax, which is satisfactory to directly use this body as a material for a substrate.

TABLE 2

| Sample No. | Amount of Y (wt. %) | Sintering Condition | Carbon (wt. %) | Y (wt. %) | Oxygen (wt. %) | Thermal Conductivity (W/mK) | Relative Density (%) |
|---|---|---|---|---|---|---|---|
| 21 | 0.2 | 1950° C. for 5 H in AlN Case | 0.01 | 0.2 | 0.4 | 200 | 99 |
| 22 | 0.2 | 1950° C. for 2 H in C Case | 0.04 | 0.2 | 0.3 | 220 | 99 |
| *23 | 0.1 | 1950° C. for 5 H in C Case | 0.15 | 0.1 | 0.1 | 140 | 95 |
| 24 | 0.8 | 1950° C. for 10 H in AlN Case | 0.04 | 0.8 | 0.3 | 240 | 99 |
| 25 | 0.8 | 2050° C. for 5 H in AlN Case | 0.08 | 0.3 | 0.05 | 260 | 99 |
| 26 | 0.2 | 1900° C. for 3 H in AlN Case | 0.005 | 0.2 | 0.2 | 180 | 100 |

*Reference Example

EXAMPLE 6

Sintered bodies of the samples Nos. 10 and 11 in Table 1 were exposed to ion beams under the following conditions: the ion generation voltage was 8 KV, the ion generation current was 0.5 mA, the angle of incidence was 30° and the sputtering time was 150 minutes. The sintered body of the sample No. 10 was sputtered only to a depth of 2 μm, while the sintered body of the sample No. 11 was sputtered to a depth of 11 μm. Thus, it is understood that the present aluminum nitride sintered body has an excellent resistance against sputtering.

EXAMPLE 7

Each sintering assistant shown in Table 3 and 5 comprises, in percent by weight, an acrylic resin, serving as a forming assistant added to aluminum nitride powder and having an average particle size of 0.5 μm, and an oxygen content of 1.0 percent by weight. The components are sufficiently mixed with each other. The mixed powder thus obtained was formed into a square platelet 35 mm×35 mm×3.0 mm in size. This formed green body was sintered in a nitrogen current at a temperature of 1,950° C. for five hours. Table 3 shows the characteristic features of each sintered body thus obtained. It is understood that the present sintered body has high thermal conductivity.

TABLE 3

| | Sintering Assistant | | Characteristics of Sintered Body | | | | |
|---|---|---|---|---|---|---|---|
| No. | Compound | (wt. %) | Relative Density (%) | Thermal Conductivity (W/mK) | Permittivity (10 MHz) | Permittivity (10 GHz) | Surface Roughness (μ) |
| 31 | Ce-stearate | 0.5 | 100 | 210 | 8 | 7.3 | 4 |
| 32 | Gd-stearate | 0.5 | 100 | 210 | 8 | 7.3 | 4 |
| 33 | Pr-stearate | 0.5 | 100 | 210 | 8 | 7.3 | 4 |
| 34 | Y-stearate | 0.3 | 100 | 220 | 8 | 7.3 | 4 |
| | Ce-stearate | 0.3 | 100 | 220 | 8 | 7.3 | 4 |
| 35 | Y-alkoxide | 0.5 | 100 | 200 | 8 | 7.3 | 4 |

EXAMPLE 8

Commercially available silver paste, gold paste, silver-palladium paste or the like was screen-printed on the surface of an aluminum nitride sintered body obtained from the sample No. 4 shown in Table 1, to be fired under atmospheric conditions at a temperature of 850 to 950° C. A conductor pattern formed on the surface of a sintered body thus obtained, had an adhesion strength of at least 1 Kg/mm². Thus, it is understood that the present aluminum nitride sintered body can be employed as a circuit board.

Figure 4:
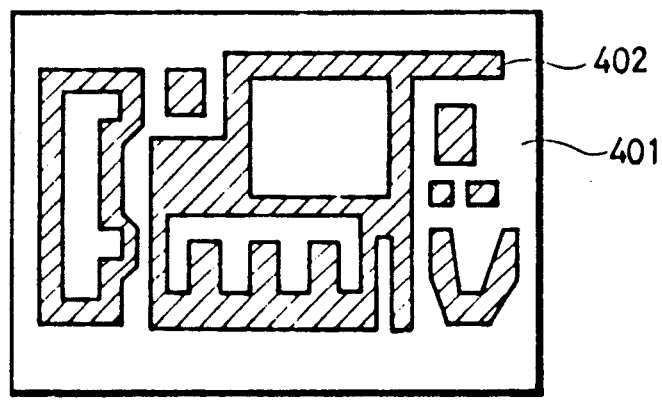
FIG. 4 is a plan view showing a circuit board made of an aluminum nitride sintered body of the invention.

FIG. 4 is a plan view showing a circuit board formed in the aforementioned manner. Referring to FIG. 4, a conductor pattern 402 of metal paste is formed on the surface of an aluminum sintered body substrate 401.

EXAMPLE 9

Similarly to Example 8, paste mainly composed of tungsten or molybdenum, was screen-printed on an aluminum nitride sintered body, which was then fired in a nitrogen air current at a temperature of 1,500° C. Thereafter nickel plating was performed to be brazed with a plate of Kovar, whereby any metallized layer having a high melting point had a high adhesion strength of about 5 Kg/mm².

Figure 5A:
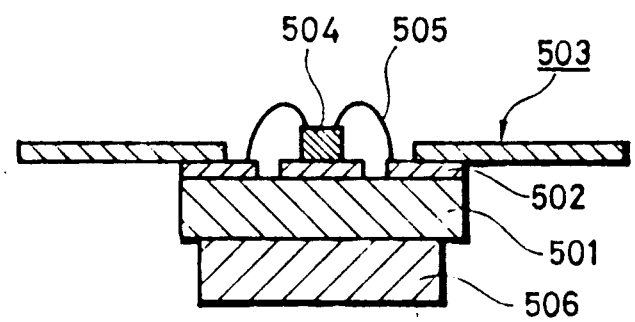
FIGS. 5A and 5B are sectional views showing junction structures of the present aluminum nitride sintered body which is employed as a package for a semiconductor device.
Figure 5B:
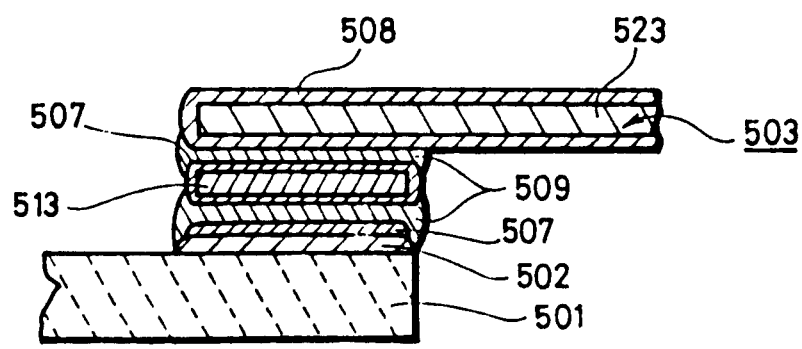

FIGS. 5A and 5B are sectional views showing ceramics packages for semiconductor devices, to which the above Example is applied. Referring to each of these FIGURES, a metallized layer 502 is formed partially on the surface of a substrate 501 of an aluminum nitride sintered body, and a lead frame 503 of a Kovar plate is brazed by a brazing metal or the like to the metallized layer 502, to be joined with the same. Preferably a cushioning member 513 of a copper plate, for example, provided with a nickel-plated layer on its surface is interposed between the metallized layer 502 and the lead frame 503, as shown in FIG. 5B. A semiconductor element 504 such as an FET of high calorific power, is secured in a prescribed position of the substrate 501 of the aluminum nitride sintered body to be connected with the metallized layer 502 or the lead frame 503 by a bonding wire 505.

Further, preferably a heat sink 506 of a tungsten alloy such as copper-tungsten alloy, for example, is mounted on the surface of the substrate 501 of the aluminum nitride sintered body. As shown in FIG. 5B, a thin plating layer 507 is formed on the metallized layer 502 in the junction between the aluminum nitride sintered body substrate 501 and the lead frame 503. The lead frame 503 is formed by a metal layer 523 of Kovar or the like and a plating layer 508 provided on the outer peripheral surface thereof as needed, in order to stabilize the wetting property of a metal brazing material 509. "Kovar" is a trade name for Fe-29wt.%Ni-17wt%Co alloy.

EXAMPLE 10

Figure 6:
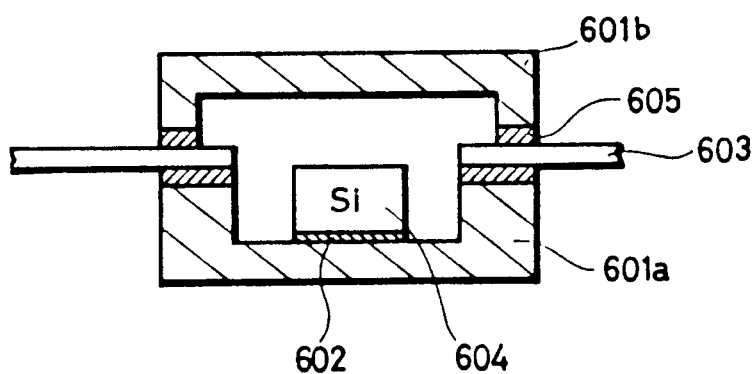
FIG. 6 is a sectional view showing a package for a semiconductor device obtained from Example 10.

An aluminum nitride ceramic substrate 15 mm square having a thickness of 0.9 mm, was obtained by a manufacturing method similar to that for the sample No. 10 in Table 1. As shown in FIG. 6, such an aluminum nitride ceramic substrate 601a had a cavity in its center. A gold-metallized layer 602 was formed in the cavity, and a silicon semiconductor element 604 was joined thereon by die bonding. A PbO, $B_2O_3$ seal glass member 604 containing a composition β-spodumene was filled in the peripheral edge portion of the aluminum nitride ceramic substrate 601a. A lead frame 603 of 42-alloy (Fe-42wt% alloy) was provided on the seal glass member 605. A cap 601b of aluminum nitride, the peripheral edge portion of which was filled with a sealing glass member 605 similarly to the aluminum nitride ceramic substrate 601a, was fixed to the lead frame 605. A ceramic package for a semiconductor device thus obtained had a thermal resistance of 20° C./W. Thus, it was possible to suppress a temperature increase of a semiconductor element carried in the package without any specific heat release mechanism.

Although the present invention has been described an illustrated in detail, it is clearly understood that the same is by way of illustration and example only and is not to be taken by way of limitation, the spirit and scope of the present invention being limited only by the terms of the appended claims.

What is claimed is:

1. An aluminum nitride sintered body, comprising 0.01 to 0.8 wt % of rare earth element, 0.2 to 0.5 wt % of oxygen, 0.001 to 0.1 wt % of carbon, and a remainder consisting essentially of aluminum nitride particles, wherein intergranular phases exist between said aluminum nitride particles, said intergranular phases having a size not more than one micron, and wherein the intergranular phases contain at least two elements selected from the group consisting of rare earth elements, aluminum, oxygen, nitrogen and carbon, said sintered body having a surface roughness of not more than 5 microns.

2. The body of claim 1, wherein said carbon and said rare earth element are present at a ratio within the range of 1/100 to 1/10 of carbon to rare earth element.

3. The body of claim 1, wherein said intergranular phases contain at least two elements selected from the group consisting of rare earth elements, aluminum, oxygen, nitrogen, and carbon, said at least two elements being present in the sintered body in an amount corresponding to not more than 0.9% by volume of said sintered body.

4. The body of claim 1, wherein said aluminum nitride particles have an average particle size of at least 5 μm.

5. The body of claim 1, wherein said body has a permittivity (dieelectric constant) of less than 8 under a high frequency of 10 GHz.

6. The body of claim 1, wherein said body has a thermal conductivity of not less than 180 W/mK.

7. An aluminum nitride sintered body, comprising 0.01 to 0.8 wt % of a rare earth element, 0.2 to 0.5 wt % of oxygen, 0.001 to 0.1 wt % of carbon, the remainder including aluminum nitride particles, said remainder further including intergranular phases existing between said aluminum nitride particles, wherein said carbon and said rare earth element are present at a ratio within the range of 1/100 to 1/10 carbon to rare earth element, wherein said intergranular phases contain at least two elements selected from the group consisting of rare earth elements, aluminum, oxygen, nitrogen, and carbon, said at least two elements being present in the sintered body in an amount corresponding to not more than 0.9% by volume, wherein said aluminum nitride particles have an average particle size of at least 5 μm.

8. The body of claim 7, wherein said body has a thermal conductivity of not less than 180 W/mK, and a surface roughness of not more than 5 μm.

9. The body of claim 7, wherein said body has a permittivity or dielectric constant of less than 8 under a high frequency of 10 GHz.

10. A method of manufacturing an aluminum nitride sintered body including 0.01 to 0.8 wt % of a rare earth element, 0.2 to 0.5 wt % of oxygen, 0.001 to 0.1 wt % of carbon, and a remainder including aluminum nitride particles, said remainder further including intergranular phases existing between said aluminum nitride particles and having a sintered body surface roughness of not more than 5 μm, said method comprising the following steps:
   (a) preparing a powder of aluminum nitride particles,
   (b) mixing said aluminum nitride powder particles with at least one rare earth metal stearate containing a rare earth metal element in an amount of 0.01 to 0.8 wt % in rare earth element conversion, said rare earth metal stearate facilitating the formation of a homogenous mixture in which said rare earth metal stearate is uniformly distributed in said aluminum nitride powder,
   (c) forming said mixture into a green body, and
   (d) sintering said green body in a non-oxidizing nitrogen atmosphere at a temperature within the range of about 1,500° C. to 2,200° C.

11. The method of claim 10, wherein said step of preparing said aluminum nitride powder provides an aluminum nitride powder containing oxygen of not more than 2.0 wt % and an average particle size of not more than 1.0 μm.

12. The method of claim 10, wherein said preparing step includes subjecting aluminum oxide powder to a reduction nitriding treatment.

13. The method of claim 10, wherein said sintering step is performed at a temperature within the range of about 1,800° C. to about 2,100° C. for at least five hours to cause a particle growth until the average particle size of said aluminum nitride particle exceeds 5 μm.

14. An aluminum nitride sintered body, comprising 0.01 to 0.8 wt % of a rare earth element, 0.2 to 0.5 wt % of oxygen, 0.001 to 0.1 wt % of carbon, the remainder including aluminum nitride particles, said remainder further including intergranular phases existing between said aluminum nitride particles, and wherein said intergranular phases contain said rare earth element, said oxygen, and aluminum.

15. The body of claim 14, wherein said carbon and said rare earth element are present at a ratio within the range of 1/100 to 1/10 of carbon to rare earth element.

16. The body of claim 14, wherein said intergranular phases further contain at least two elements selected from the group consisting of rare earth elements, aluminum, oxygen, nitrogen, and carbon, said at least two elements being present in the sintered body in an amount corresponding to not more than 0.9% by volume.

17. The body of claim 14 wherein said aluminum nitride particles have an average particle size of at least 5 μm.

18. The body of claim 14, wherein said body has a permittivity or dielectric constant of less than 8 under a high frequency of 10 GHz.

19. The body of claim 14, wherein said body has a thermal conductivity of not less than 180 W/mK.

20. The body of claim 14, having a surface roughness, after sintering, of not more than 5 μm.

21. The body of claim 14, wherein said rare earth element, said oxygen, and said aluminum are present as isolated inclusions between said aluminum nitride particles, whereby said inclusions are separated from one another by said aluminum nitride particles in said sintered body.

22. An aluminum nitride sintered body including 0.01 to 0.8 wt % of a rare earth element, 0.2 to 0.5 wt % of oxygen, 0.001 to 0.1 wt % of carbon, and a remainder including aluminum nitride particles, said remainder further including intergranular phases existing between said aluminum nitride particles and having a sintered body surface roughness of not more than 5 μm, said body being made by the following steps:
   (a) preparing a powder of aluminum nitride particles,
   (b) mixing said aluminum nitride powder particles with at least one rare earth metal stearate containing a rare earth metal element in an amount of 0.01 to 0.8 wt % in rare earth element conversion, said rare earth metal stearate facilitating the formation of a homogeneous mixture in which said rare earth metal stearate is uniformly distributed in said aluminum nitride powder,
   (c) forming said mixture into a green body, and (d) sintering said green body in a non-oxidizing nitrogen atmosphere at a temperature within the range of about 1,500° C. to 2,200° C.

23. An aluminum nitride sintered body prepared from a green body, said green body comprising a sintering assistant in the form of a rare earth metal stearate containing a rare earth element in an amount of 0.01 to 0.8 wt % in rare earth element conversion for facilitating a homogeneous mixture, so that the rare earth metal stearate is uniformly distributed in said green body and uniformly adhered to the surface of all aluminum nitride particles forming the remainder in said green body, said sintered body comprising 0.01 to 0.8 wt % of said rare earth element, 0.2 to 0.5 wt % of oxygen, and 0.001 to 0.1 wt % of carbon, said remainder of said sintered body including intergranular phases between aluminum nitride particles.

* * * * *